(12) United States Patent
Fayneh et al.

(10) Patent No.: US 7,605,668 B2
(45) Date of Patent: Oct. 20, 2009

(54) DELAY STAGE WITH CONTROLLABLY VARIABLE CAPACITIVE LOAD

(75) Inventors: Eyal Fayneh, Givatyim (IL); Ernest Knoll, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/609,819

(22) Filed: Dec. 12, 2006

(65) Prior Publication Data

US 2008/0136545 A1 Jun. 12, 2008

(51) Int. Cl.
*H03B 5/24* (2006.01)
(52) U.S. Cl. ........................ 331/36 C; 331/57
(58) Field of Classification Search ........... 331/36 C, 331/57
See application file for complete search history.

(56) References Cited

U.S. PATENT DOCUMENTS 5,317,287 A * 5/1994 Brown .................. 331/57
6,313,615 B1 11/2001 Fayneh
6,329,882 B1 12/2001 Fayneh
6,396,358 B1 * 5/2002 Poss et al. .................. 331/57
6,546,059 B1 4/2003 Knoll
6,630,855 B2 10/2003 Fayneh
6,661,213 B2 12/2003 Fayneh
6,894,569 B2 5/2005 Fayneh
6,922,047 B2 7/2005 Knoll
7,095,289 B2 8/2006 Knoll
7,120,839 B2 10/2006 Fayneh
7,265,637 B2 9/2007 Knoll
2008/0150596 A1 6/2008 Fayneh
2008/0157880 A1 7/2008 Fayneh

* cited by examiner

*Primary Examiner*—Joseph Chang
(74) *Attorney, Agent, or Firm*—Erik R. Nordstrom

(57) ABSTRACT

Disclosed herein are embodiments of controllably variable capacitor loads that may be used with delay stages or other elements, for example, in a voltage controlled oscillator.

11 Claims, 2 Drawing Sheets

DELAY STAGE WITH CONTROLLABLY VARIABLE CAPACITIVE LOAD

BACKGROUND

The present invention relates generally to adjustable delay stage capacitive loads, e.g., for a voltage controlled oscillator (VCO) or a controllable delay line. VCO circuits are used in a variety of applications including circuits such as phase locked loops (PLLs) to generate signals with controllable frequencies, for example, with a PLL to generate a data link clock or the clock of a CPU. VCOs typically comprise one or more delay stages whose load (or loads) can be controllably changed to change the generated output frequency. For example, one type of VCO design comprises inverters coupled together in a ring oscillator configuration, with one or more of the inverter outputs adjustably loaded to control the frequency of the ring oscillator.

Unfortunately, they can be adversely affected by noise and other non ideal factors resulting in errors such as phase jitter, where the edges of the generated signal are not maintained consistently spaced apart from one another. Accordingly, improved adjustable delay stage designs, e.g., for a VCO, would be desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
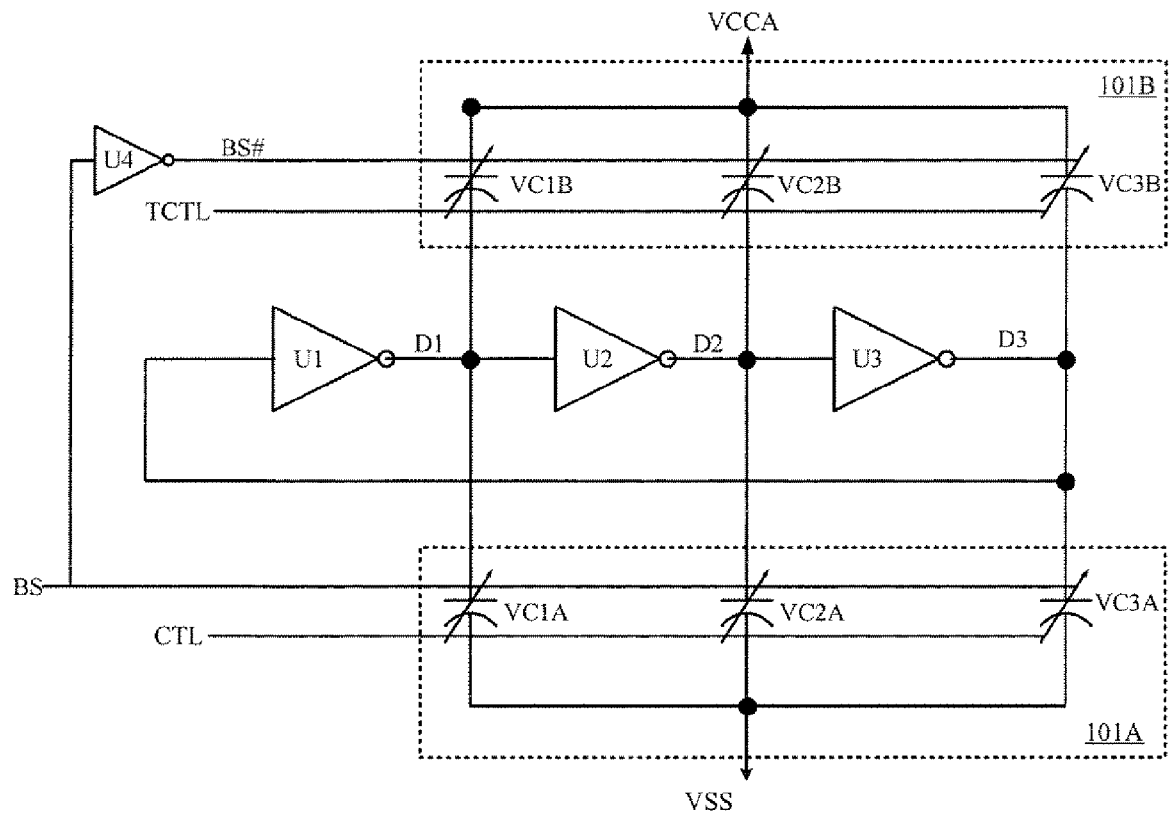
FIG. 1 is a schematic diagram of a VCO in accordance with some embodiments.

FIG. 1 shows a voltage controlled oscillator (VCO) in accordance with some embodiments of the invention. It generally comprises inverter stages U1, U2, and U3 coupled together as shown in a ring oscillator configuration. The inverter stages have outputs (D1, D2, D3) that are collectively coupled to a first controllably variable capacitor load section 101A and to a second controllably variable capacitor load section 101B. In turn, the first and second controllably variable capacitor load sections are coupled together as shown between a high supply reference (VCCA) and a low supply reference (VSS). In the depicted embodiments the inverter stages, with their capacitive loads, are equivalently configured with respect to each other. Accordingly, an output for the VCO (e.g., to be provided to one or more downstream loads) could be tapped from any of the inverter outputs D1, D2, or D3. (it should be appreciated, however, that it may be desirable to appropriately drive the selected output load or include "dummy" loads for the other outputs to balance them.)

(Note that the depicted circuit is an example of a suitable VCO design for implementing principles of the invention. However, various other VCO embodiments could be used. In fact, inventive embodiments may not even be implemented in a VCO, e.g., they could be implemented in a controllable delay line, delay locked loop or other circuit using a controllably variable delay stage. Likewise, it should be appreciated that even with the depicted circuit, different implementations could be used. For example, differential, as well as single-ended signals, could be employed. Different numbers of delay stages with different combinations of inverting and/or non-inverting stages could also be used, and the controllably variable capacitive loads may be used with some or all of the delay stages.)

Each controllably variable capacitor load section (101A, B) comprises separate variable capacitor circuits: VC1A, VC2A VC3A (first load section 101A) and VC1B, VC2B, and VC3B (second capacitor load section 101B). In the depicted embodiment, a separate variable capacitor circuit from each of the first and second sections is coupled to an associated inverter delay stage output. The variable capacitor circuits from the first section 101A are coupled between their inverter outputs and the low supply reference (VSS), while the circuits from the second section 101B are coupled between their inverter outputs and the high supply reference (VCCA).

The first controllably variable capacitor load section 101A serves as a primary, variable capacitive load to control the delay of the stage, thus the clock frequency generated by the VCO. It receives a band select (BS) signal and a control (CTL) signal. The BS signal coarsely adjusts the load circuit capacitances (e.g., on a stepwise basis) for selecting a desired capacitance range, while the CTL signal adjusts the load circuit capacitances on a continuous (analog) mode for real-time control of the stage delays, and consequently the generated VCO frequency. The CTL signal may, for example, correspond to a control signal from a charge pump in a phase locked loop circuit to control the frequency of the generated clock or in a delay locked loop to control the delay of the delay line. In the depicted embodiment, the load capacitance is proportional to CTL, thus the generated output frequency of the VCO is inversely proportional to the load capacitance. Accordingly, the generated frequency, in this case, will be inversely proportional to the control voltage CTL.

The second controllably variable capacitor load section 101B functions to provide a temperature compensating capacitive load to lessen the affect that changes in temperature will have on the stage delay, and consequently to the frequency response of the VCO as a function of the CTL voltage. It receives the band select signal (albeit an inverted version BS#) and a control signal (TCTL) that controls the capacitance of the second section's capacitor load components. As with the first section 101A, the band select signal (BS) selects between two different capacitive load ranges (in cooperation with the two ranges selectable from the first section 101A) to provide two overall capacitive load range options for the collective VCO load. On the other hand, the control signal (TCTL), in a continuous mode, controls its capacitance in response to changes in circuit temperature. The TCTL signal is derived from a temperature compensation circuit, an example of which is discussed below with reference to FIG. 4.

Figure 2:
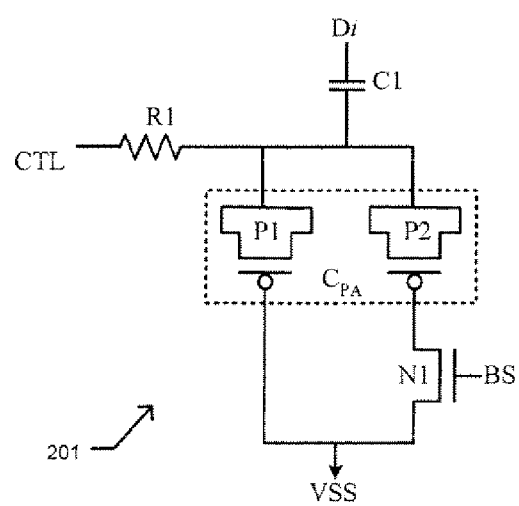
FIG. 2 is a schematic diagram of a voltage controllable variable capacitor circuit in accordance with some embodiments.

FIG. 2 shows an exemplary controllably variable capacitor circuit 201 from the first load section 101A (e.g., VC1A, VC2A, or VC3A). It is essentially a passive circuit that does not substantially contribute to the VCO output phase noise. In fact, its capacitance vs. voltage curve can be substantially monotonic, which allows for a monotonic VCO frequency change with a fairly constant gain. The depicted capacitor circuit generally comprises a resistor R1, capacitor C1, PMOS capacitors P1, P2, and an NMOS transistor switch N1, all coupled together as shown. Resistor R1 functions to suitably isolate the output of the associated delay stage from a low impedance, DC control signal (CTL) source. In some embodiments, a resistor in the range of about 10K Ohms may be used.

Each PMOS capacitor is formed from a conventional PMOS transistor, as is known in the art, by using its coupled together drain/source as one capacitor terminal and its gate as the other capacitor terminal. The MOS capacitors are controllably variable in that their capacitance levels increase (e.g., fairly linearly) as the DC voltage across their drain-source to gate terminals increases. Thus, as the voltage level of CTL increases so to do the capacitance's of P1 and P2. (The term "PMOS transistor" refers to a P-type metal oxide semiconductor field effect transistor. Likewise, "NMOS transistor" refers to an N-type metal oxide semiconductor field effect transistor. It should be appreciated that whenever the terms: "transistor", "MOS transistor", "NMOS transistor", or "PMOS transistor" are used, unless otherwise expressly indicated or dictated by the nature of their use, they are being used in an exemplary manner. They may encompass the different varieties of MOS devices including devices with different VTs and oxide thicknesses to mention just a few. Moreover, unless specifically referred to as MOS or the like, the term transistor can include other suitable transistor types, e.g., junction-field-effect transistors, bipolar-junction transistors, and various types of three dimensional transistors, known today or not yet developed.)

Capacitor C1 functions to decouple the DC control voltage (CTL) from the VCO generated high-frequency voltage at the associated delay stage output. It may be implemented with any suitable capacitor such as with a conventional metal MOS-process capacitor. However, it should be large enough, relative to the PMOS capacitors P1, P2 to provide desired capacitance range, based primarily on P1 and P2, to an associated delay stage output. That is, it is in series with the combination of P1 and P2 so the capacitances are inversely additive. The capacitance, C, of the variable capacitor circuit 201, as seen by the delay stage output is $(C C1 CPA)/(C_{C1}+C_{PA})$ (where $C_{C1}$ is the capacitance of C1 and $C_{PA}$ is the overall capacitance attributable to P1 and P2). Thus, as $C_{C1}$ gets larger, the overall capacitance C approaches $C_{PA}$, which becomes the dominant capacitance. This may be desired in order for the CTL signal to have a wider range of controllable capacitive variation.

Transistor N1 functions as a switch to either engage or disengage P2 with/from P1. Since capacitors in parallel are additive, the value of $C_{PA}$ is P1+P2 when P2 is engaged (BS High, turning on N1). Conversely, $C_{PA}$ is equal to P1 when P2 is disengaged (BS Low, turning off N1). Thus, when BS is asserted (High), the controllably variable capacitor circuit 201 is in a higher capacitance range, which corresponds to a lower VCO frequency band.

Figure 3:
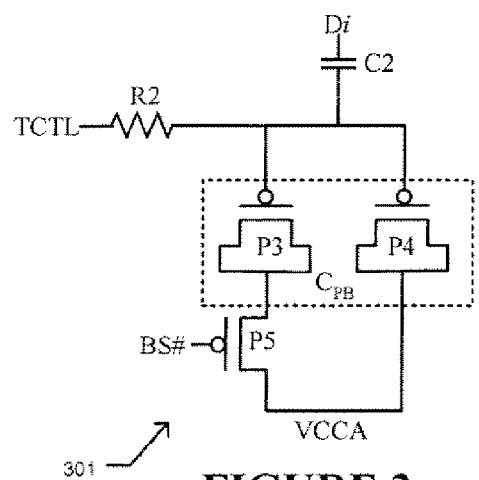
FIG. 3 is a schematic diagram of another voltage controllable variable capacitor circuit in accordance with some embodiments.

FIG. 3 shows an exemplary controllably variable capacitor circuit 301 from the second load section 101B (e.g., VC1A, VC2A, or VC3A). It is essentially the same as controllably variable capacitor circuit 201, except that it is coupled between the high supply reference (VCCA) and a delay stage output (Di) instead of the low reference (VSS) and Di, and it uses a PMOS transistor P5 as a switch to engage or disengage a PMOS capacitor P3 with a PMOS capacitor P4. Accordingly, its band select signal (BS#) is active Low to turn on P5 when P3 is to be engaged. Thus, when BS is asserted (High), N1 and P5 turn on to engage P2 and P3 thereby causing the overall VCO load to be at a higher capacitor range and thus operating at a lower frequency band. Conversely, when BS is de-asserted (Low), N1 and P5 turn off to disengage P2 and P3 causing the VCO to operate at the higher frequency band.

Figure 4:
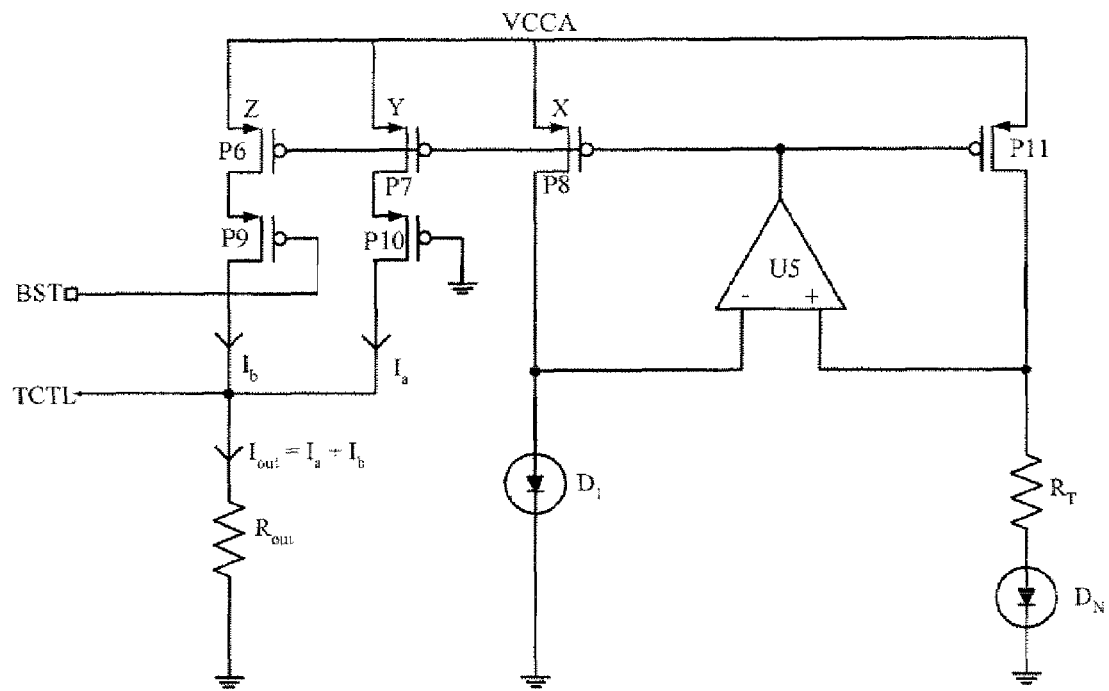
FIG. 4 is a schematic diagram of a conventional temperature compensation circuit suitable for use with a VCO in accordance with some embodiments.

FIG. 4 shows an exemplary, conventional temperature compensation circuit, suitable for use to generate the TCTL signal in FIGS. 1 and 3. It generally comprises resistors $R_{out}$, $R_T$; PMOS transistors P6 to P11; amplifier U5; and diodes $D_1$ and $D_N$, all coupled together as shown. Diode $D_N$ is N times larger than $D_1$ and thus has a smaller voltage dropped across it. Because amplifier U5 is configured with negative feedbacks it forces the voltages at its input terminals (+, −) to be substantially equivalent. Accordingly, in view of the relative affect that temperature change has on $D_N$ and $D_1$, a voltage is dropped across $R_T$ that is substantially linearly proportional to the ambient temperature of the circuit. This voltage drop proportionally controls the current in P11, which in effect is mirrored to P7 and P6 (if engaged).

Thus, the current ($I_{out}=I_a+I_b$) generated in P7 and P6 (when engaged) is proportional to the circuit temperature. In turn, the voltage, TCTL, across $R_{out}$ will be indicative of the circuit temperature and thus control the capacitance of the second controllably variable capacitive load section 101B based on the temperature. Note that the actual TCTL voltage level can be calibrated by setting the current ratio Y/X to a desired value.

In the depicted embodiment, the temperature compensation circuit is also used to establish a separate VCO operating frequency band. This is achieved with temperature dependent current source transistor P6, which is engaged or disengaged by P9 based on the state of a temperature band select signal (BST). When BST is asserted, the current from the switched current source P6 is added to the current from current source P7. This changes the level of the temperature control voltage (TCTL) in a step, which effectively provides for a separate operating band. When P6 is engaged, TCTL "steps" upward, causing the second controllably variable capacitive load section 101B to be at a lower capacitance range, which corresponds to a higher frequency band. In some embodiments, this temperature band select acts like a fine tune adjustment on the primary band select (BS, BS#), which acts like a course band select adjustment.

Figure 5:
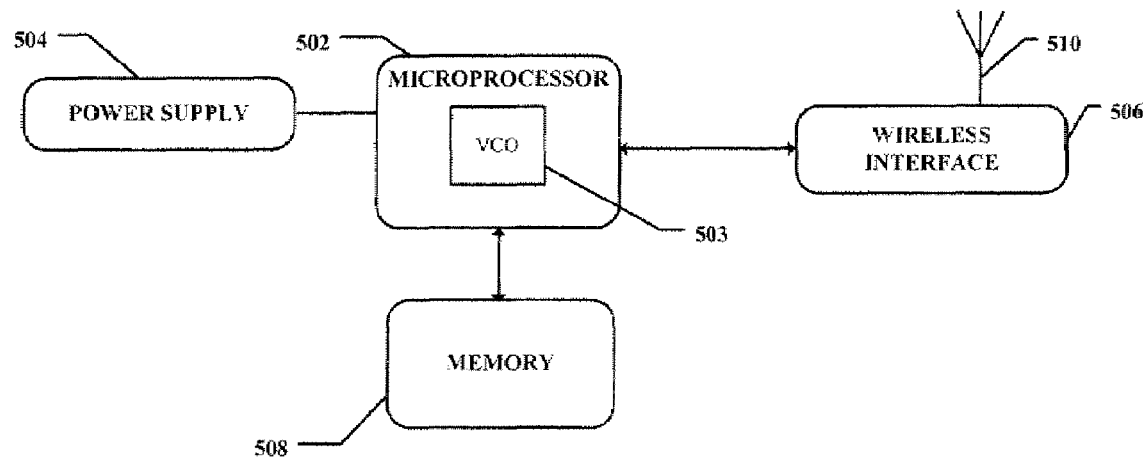
FIG. 5 is a block diagram of a computer system having a microprocessor with at least one VCO circuit in accordance with some embodiments.

With reference to FIG. 5, one example of a computer system is shown. The depicted system generally comprises a processor 502 that is coupled to a power supply 504, a wireless interface 506, and memory 508. It is coupled to the power supply 504 to receive from it power when in operation. The wireless interface 506 is coupled to an antenna 510 to communicatively link the processor through the wireless interface chip 506 to a wireless network (not shown). Microprocessor 502 comprises one or more VCO circuits 503, such as the circuit of FIG. 1, with one or more delay stages having controllably variable capacitive loads. For example, a VCO 503 may be implemented in a PLL to link the processor with the memory 508 and/or wireless interface 506.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An integrated circuit, comprising:
a VCO to generate a clock with a clock frequency, the VCO comprising a controllably variable capacitive load to control the clock frequency in response to a control signal and a temperature compensation signal, the controllably variable capacitive load comprising a first load section with a capacitance that is controllably variable in response to the control signal and a second load section with a capacitance that is controllably variable in response to the temperature compensation signal.

2. The integrated circuit of claim 1, in which the first and second load sections are coupled together between a high and low supply reference.

3. The integrated circuit of claim 1, in which the first and second load sections provide a frequency band adjustment for the VCO.

4. The integrated circuit of claim 1, in which the controllably variable capacitive load comprises at least one MOS capacitor.

5. The integrated circuit of claim 4, in which the MOS capacitor is coupled between a supply reference and a fixed capacitor.

6. The integrated circuit of claim 1, in which the VCO comprises a ring oscillator having a plurality of delay stages, the controllably variable capacitive load having controllably variable capacitor circuits coupled to outputs of the plurality of delay stages.

7. The integrated circuit of claim 6, in which each delay stage has an output with first and second controllably variable capacitor load circuits coupled to its output.

8. An integrated circuit comprising:
a delay stage having an output;
a first controllably variable capacitor circuit coupled between the output and a first supply reference; and
a second controllably variable capacitor circuit coupled between the output and a second supply reference, the first and second controllably variable capacitor circuits comprising at least one MOS capacitor, and the second controllably variable capacitor circuit providing a fine tune load capacitance adjustment and being controlled by a temperature compensation signal to control its capacitance.

9. The integrated circuit of claim 8, in which the delay stage is part of a controllably variable delay line.

10. The integrated circuit of claim 8, in which the delay stage is part of a VCO.

11. A computer system, comprising:
(a) a microprocessor comprising a VCO having a plurality of inverter stages, wherein at least one stage has an output, a first controllably variable capacitor circuit coupled between the output and a first supply reference, and a second controllably variable capacitor circuit coupled between the output and a second supply reference, wherein the first and second controllably variable capacitor circuits comprise at least one MOS capacitor, the first controllably variable capacitor circuit providing a fine tune load capacitance adjustment and the second controllably variable capacitor circuit controlled by a temperature compensation signal to control its capacitance;
(b) an antenna; and
(c) a wireless interface coupled to the microprocessor and to the antenna to communicatively link the microprocessor to a wireless network.

* * * * *